US006576489B2

(12) United States Patent
Leung et al.

(10) Patent No.: US 6,576,489 B2
(45) Date of Patent: Jun. 10, 2003

(54) METHODS OF FORMING MICROSTRUCTURE DEVICES

(75) Inventors: Toi Yue Becky Leung, Santa Clara, CA (US); Jeffrey D. Chinn, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/850,923

(22) Filed: May 7, 2001

(65) Prior Publication Data

US 2002/0164879 A1 Nov. 7, 2002

(51) Int. Cl.$^7$ ....................... H01L 21/00; H01L 21/479; C23E 1/00
(52) U.S. Cl. .................... 438/52; 438/477; 438/706; 216/2
(58) Field of Search ................... 438/689, 690, 438/694, 704, 705, 706, 745, 756, 757, 471, 120, 426, 455, 50, 52; 216/2

(56) References Cited

U.S. PATENT DOCUMENTS

| 5,079,600 | A | | 1/1992 | Schnur et al. |
| 5,429,708 | A | | 7/1995 | Linford et al. |
| 5,537,083 | A | | 7/1996 | Lin et al. |
| 5,694,740 | A | | 12/1997 | Martin et al. |
| 6,002,549 | A | | 12/1999 | Berman et al. |
| 6,020,247 | A | | 2/2000 | Wilk et al. |
| 6,114,044 | A | * | 9/2000 | Houston et al. ............... 216/74 |
| 6,159,540 | A | * | 12/2000 | Menon et al. ............... 106/490 |
| 6,265,026 | B1 | * | 7/2001 | Wang ....................... 427/248.1 |

OTHER PUBLICATIONS

"Plasma enhanced chemical vapor deposition of fluorocarbon thin film via $CF_3H/H_2$ chemistries: Power, pressure and feed stock composition" Jay J. Sankevich and David E. Sherrer II; J. Vac. Sci. Technol. A18(2) Mar./Apr. 2000; pp. 377–384.

"A New Class of Surface Modifiers For Stiction Reduction"; Bong–Hwan Kim, et al; IEEE; 1999; pp. 189–193.

"Thin Teflon–Like Films For Eliminating Adhesion In Released Polysilicon Microstructures"Bradley K. Smith et al.; 1997 International Conference on Solid–State Sensors and Actuators; p. 245–248.

"Surface Micromachining for Microelectromechanical System"; James M. Bustillo et al.; Proceedings of the IEEE, vol. 86, No. 8, Aug. 1998 pp. 1552–1574.

"Alkyltrichlorosilane–Based Self–Assembled Monolayer Films for Stictions Reduction in Silicon Micromachines"; Uthara Srinivasa et al; Journal of Microelectromechanical System; vol. 7, No. 7, Jun. 1998.

"Alkyltrichlorosilane–Based Self–Assembled Monolayer Films for Stiction Reduction in Silicon Micromachines"; Uthara Srinivasa et al; Journal of Microelectromechanical System; vol. 7, No. 2; Jun. 1998.

"Dry Release for Surface Micromachining with HF Vapor–Phase Etching"; Yong–IL Lee et al; Journal of Microelectromechanical System; vol. 6, No. 3; Sep. 1997.

"Dry Release for Surface Micromachining with HF Vapor–Phase Etching"; Yong–II Lee et al; Journal of Microelectromechanical System; vol. 6, No. 3; Sep. 1997.

(List continued on next page.)

Primary Examiner—William David Coloman
(74) Attorney, Agent, or Firm—Shirley L. Church; Kathi Bean (57) ABSTRACT

The invention includes methods of forming microstructure devices. In an exemplary method, a substrate is provided which includes a first material and a second material. At least one of the first and second materials is exposed to vapor-phase alkylsilane-containing molecules to form a coating over the at least one of the first and second materials.

19 Claims, 4 Drawing Sheets

OTHER PUBLICATIONS

"Silicon micromechanics: sensors and actuators on a chip"; Roger T. Howe et al.; 1990 IEEE; IEEE Sepctrum Jul. 1990; pp. 30–35.

"Self–Assembled Fluorocarbon Films for Enhanced stiction Reduction"; Uthara Srinivasan et al; 1997 International Conference on Solid–State Sensors and Actuators; IEEE 1997; pp. 1399–1402.

"Elimination of Post–Release Adhesion in Microstructures Using Conformal Fluorocarbon Coatings"; Piu Francis Man et al.; IEEE 1997; Journal of Microelectromachanical Systems; vol. 6, No. 1, Mar. 1997; pp. 25–34.

"Fluorocarbon film for protection from alkaline etchant and elimination of in–use stiction"; Yoshinori Matsumoto et al; 1997 International Conference on Solid–State Sensors and Actuators; 1997 IEEE; pp. 695–698.

* cited by examiner

METHODS OF FORMING MICROSTRUCTURE DEVICES

TECHNICAL FIELD

The invention pertains to methods of forming microstructure devices, such as, for example, methods of forming microelectromechanical systems (MEMS).

BACKGROUND OF THE INVENTION

There are numerous applications developed, and being developed, for microstructures, such as, for example, microelectromechanical systems (MEMS). The microstructures are commonly fabricated from semiconductive materials, such as, for example, silicon. Frequently, a microstructure will include a pair of components which are spaced from one another, and which move relative to one another during operation of the microstructure. Ideally, the components can be repeatedly moved together and apart. However, a problem that can occur in forming and using microstructures is that semiconductive materials formed into MEMS can irreversibly adhere to one another as they are moved toward one another or during the fabrication process. Such problem can be manifested as an inability to release the materials, and the release-related problem is typically referred to in the art as "stiction".

Figure 1:
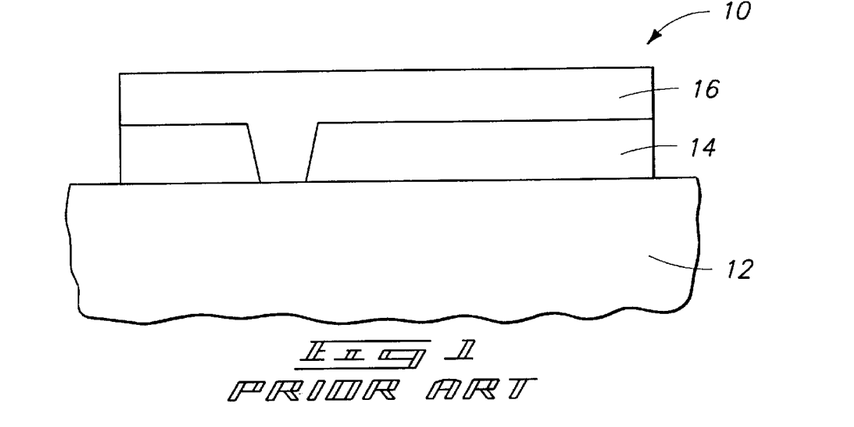
FIG. 1 is a diagrammatic, cross-sectional view of a prior art assembly shown at a preliminary step during micromachining of a microstructure.

An exemplary prior art fabrication process for forming a microstructure device is described with reference to FIGS. 1–3. Referring initially to FIG. 1, a portion of a prior art semiconductive assembly 10 is shown in fragmentary view at a step occurring during a micromachining process. Assembly 10 comprises a first semiconductive material 12, a sacrificial layer 14 over material 12, and a second semiconductive material 16 over sacrificial layer 14. Semiconductive material 12 can comprise, for example, a single-crystal silicon wafer, or can comprise silicon in a polycrystalline or amorphous form. Sacrificial layer 14 can comprise, for example, silicon dioxide or organic films; and second semiconductive material 16 can comprise, for example, polycrystalline or amorphous silicon. Material 12 can be referred to as a semiconductive material substrate, or alternatively a combination of materials 12 and 14 can be referred to as a semiconductive material substrate. To aid in interpretation of this disclosure and the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

It is to be understood that the above described materials 12, 14 and 16 are exemplary materials, and that other materials can be utilized. For instance, material 16 will sometimes comprise silicon nitride, and sacrificial material 14 will sometimes be silicon.

Figure 2:
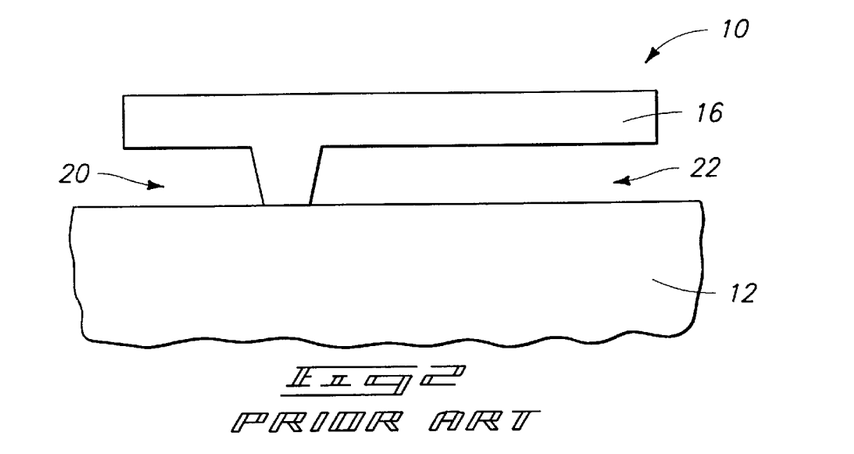
FIG. 2 is a view of the FIG. 1 assembly shown at a prior art processing step subsequent to that of FIG. 1.

Referring next to FIG. 2, sacrificial layer 14 (FIG. 1) is removed to leave a first gap 20 between a portion of first semiconductive material 12 and second semiconductive material 16, and a second gap 22 between another portion of first semiconductive material 12 and second semiconductive material 16. Second semiconductive material 16 defines a beam supported by first semiconductive material 12. If sacrificial material 14 comprises silicon dioxide, such can be removed utilizing a hydrofluoric acid etch.

Figure 3:
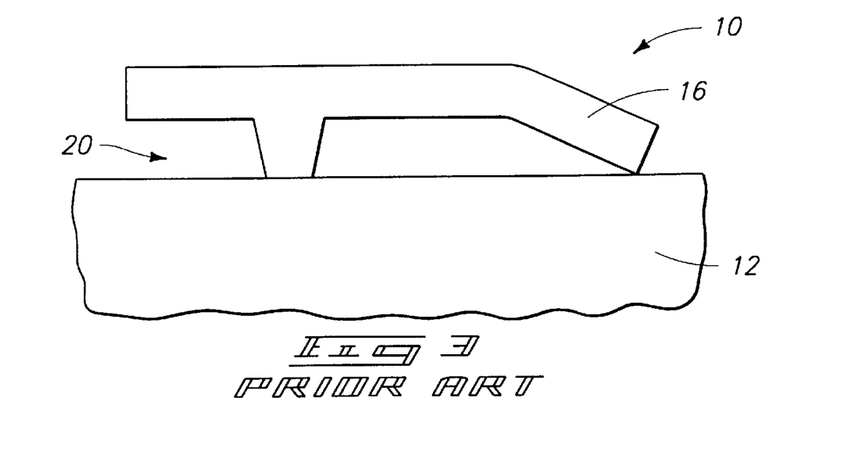
FIG. 3 is a view of the FIG. 1 assembly shown at a prior art processing step subsequent to that of FIG. 2, and illustrating stiction.

Referring next to FIG. 3, a stiction problem is illustrated. Specifically, a portion of second semiconductive material 16 has moved relative to first semiconductive material 12 and is non-releasably adhered to the first semiconductive material. The movement of second semiconductive material 16 relative to first semiconductive material 12 can occur either during operation of a device comprising assembly 10, or during removal of sacrificial layer 14. If the stiction occurs concomitantly with removal of sacrificial layer 14 (FIG. 1) it is referred to as "release-related stiction", and if it occurs after removal of sacrificial layer 14, (for example, during utilization or shipping of a microstructure comprising assembly 10), it is referred to as "in-use stiction."

It has been recognized that one way to alleviate the release-related stiction is to use supercritical $CO_2$ drying. Also, it has been recognized that one way to alleviate in-use stiction is to form a self-assembled monolayer (SAM) coating across semiconductive material surfaces to alleviate binding of the surfaces to one another. An exemplary SAM coating can be formed by exposing a semiconductive material surface to an alkyltrichlorosilane ($RSiCl_3$), such as, for example, octadecyltrichlorosilane [$CH_3(CH_2)_{17}SiCl_3$; OTS] or 1H, 1H,2H,2H-perfluorodecyltrichlorosilane [$CF_3(CF_2)_7(CH_2)_2SiCl_3$; FDTS]. Alternatively, an exemplary SAM coating can be formed by exposing a semiconductive material surface to a dialkyldichlorosilane ($R_2SiCl_2$).

For purposes of interpreting this disclosure and the claims that follow, semiconductive materials 16 and 12 are referred to as being moved relative to one another if either of components 12 and 16 comprises a portion which moves relative to a portion of the other of the components. In particular applications, both of components 12 and 16 can be moved when the components are moved relative to one another.

SUMMARY OF THE INVENTION

In one aspect, the invention encompasses a method of forming a microstructure device. A substrate is provided within a reaction chamber. The substrate has a first surface spaced from a second surface, and is ultimately to be incorporated into the microstructure device. The first and second surfaces are ultimately to be movable relative to one another in the microstructure device. Alkylsilane-containing molecules are introduced into the reaction chamber in a vapor phase, and at least one of the first and second surfaces is exposed to the alkylsilane-containing molecules to form a coating on the at least one of the first and second surfaces.

In another aspect, the invention encompasses another method of forming a microstructure device. A substrate is provided which has a first semiconductive material surface separated from a second semiconductive material surface by a gap. At least one of the first and second semiconductive material surfaces is exposed to OH radicals. After the exposure to the OH radicals, the at least one of the first and second semiconductive material surfaces is exposed to vapor-phase alkylsilane-containing molecules to form a coating over the at least one of the first and second semiconductive material surfaces.

In yet another aspect, the invention encompasses another method of forming a microstructure device. A substrate is provided which has a first semiconductive material, a second semiconductive material, and a sacrificial material between the first and second semiconductive materials. The substrate is exposed to vapor-phase etchant to remove at least some of the sacrificial material from between the first and second semiconductive materials, and subsequently at least one of the first and second semiconductive materials is exposed to vapor-phase alkylsilane-containing molecules to form a coating over the at least one of the first and second semiconductive materials. The method can be utilized to solve both release-related and in-use stiction problems.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The invention utilizes vapor-phase treatments of microstructure devices to alleviate or prevent stiction. A process encompassed by the present invention is described with reference to the flow-chart diagram of FIG. 4, and the processing diagrams of FIGS. 5–10.

Figure 5:
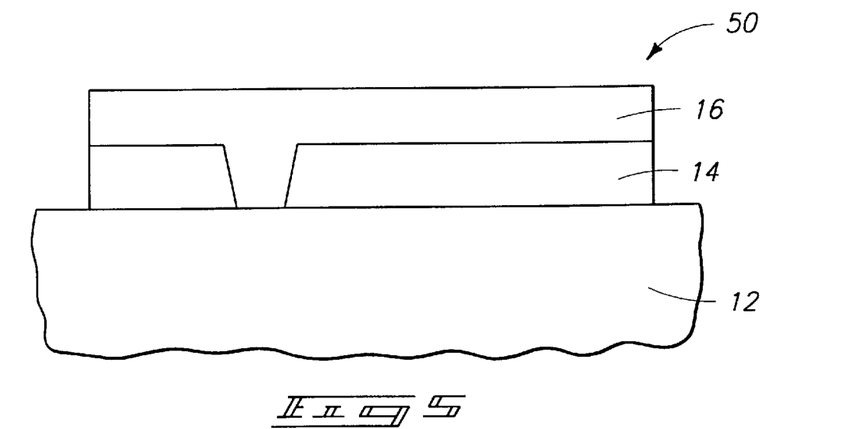
FIG. 5 is a diagrammatic, cross-sectional view of an assembly shown at a preliminary processing step of a micromachining process encompassed by the present invention.

An assembly 50 is shown in FIG. 5 at a processing step identical to that shown in FIG. 1 for assembly 10. Assembly 50 comprises the same materials described above with reference to assembly 10 of FIG. 1, and accordingly can comprise a first semiconductive material 12, a second semiconductive material 16, and a sacrificial material 14 between the first and second semiconductive materials. In alternative constructions, second material 16 can comprise silicon nitride.

Assembly 50 can alternatively be referred to as a substrate 50, with at least a portion of such substrate ultimately being incorporated into a microstructure device.

Figure 10:
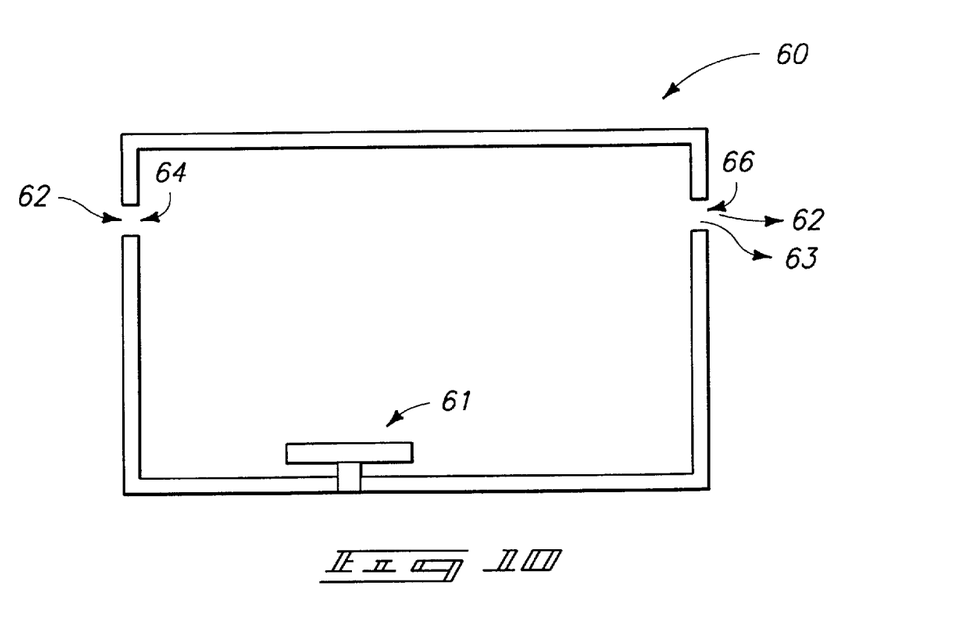
FIG. 10 is a diagrammatic, cross-sectional view of a reaction chamber which can be utilized in methodology of the present invention.

Substrate 50 is preferably provided within a reaction chamber during processing of the present invention, and in preferred embodiments substrate 50 can remain within the same reaction chamber during several consecutive steps utilized in methodology of the present invention. An exemplary reaction chamber 60 is illustrated in FIG. 10. A mass 61 is illustrated retained within chamber 60, and mass 61 can comprise substrate 50. Reaction chamber 60 comprises at least one inlet port 64 and at least one outlet port 66. In operation, vapor-phase reactants 62 can flow into chamber 60 through inlet port 64, and products 63 and/or unreacted reactants 62 can flow out of chamber 60 through outlet port 66.

Figure 4:
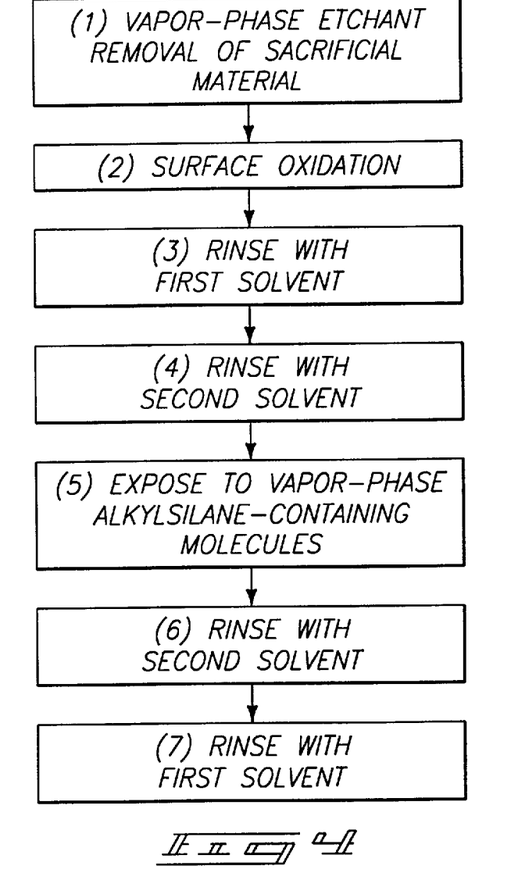
FIG. 4 is a flow-chart diagram of a method encompassed by the present invention.

At step (1) of the FIG. 4 process, sacrificial material 14 (FIG. 5) is removed with a vapor-phase etchant. For instance, if sacrificial material 14 comprises silicon dioxide, such can be removed with vapor-phase hydrofluoric acid (HF); or if sacrificial material 14 is silicon, such can be removed with vapor-phase xenon difluoride ($XeF_2$). In alternative embodiments of the present invention, sacrificial material 14 can be removed with a liquid-phase etchant. However, it can be preferable to utilize vapor-phase etchants in that it can be desirable to avoid water condensation on semiconductive materials 12 and 16, and thus release-related stiction can be avoided.

Figure 6:
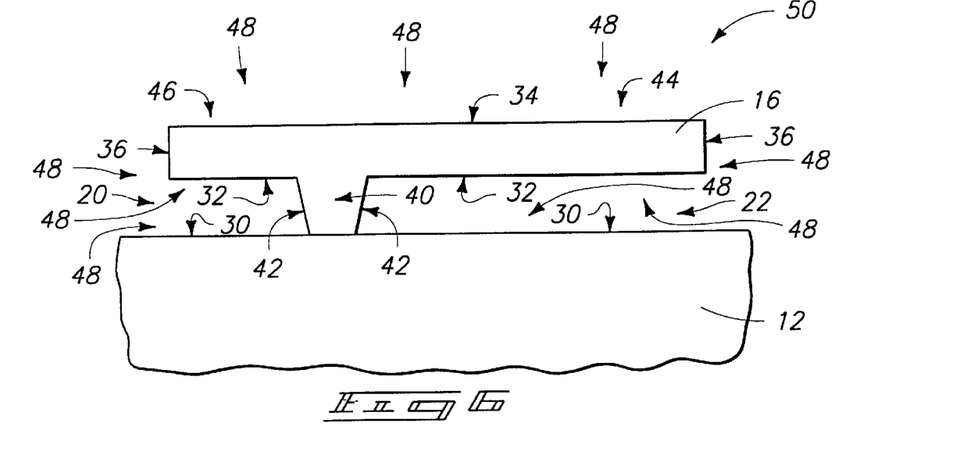
FIG. 6 is a view of the FIG. 5 assembly shown at a processing step subsequent to that of FIG. 5.

FIG. 6 illustrates structure 50 after removal of sacrificial material 14 (FIG. 5). The structure of FIG. 6 has gaps 20 and 22 extending between semiconductive materials 16 and 12. In the shown embodiment, semiconductive material 12 has an upper surface 30, and semiconductive material 16 has a lower surface 32 spaced from upper surface 30 by gaps 20 and 22. Semiconductive material 16 is illustrated to further comprise an upper surface 34, and sidewall surfaces 36 extending between lower surface 32 and upper surface 34. Semiconductive material 16 also has an anchor (or stem) 40 which adheres to semiconductive material 12 and connects semiconductive material 16 to semiconductive material 12. Typically, anchor 40 comprises the same material as material 16, but it is to be understood that anchor 40 can also comprise different materials than material 16. Anchor 40 has sidewall surfaces 42 defining a lateral periphery thereof. Semiconductive material 16 has a first portion 44 on one side of anchor 40, and a second portion 46 on the other side of anchor 40, with portions 44 and 46 together defining a beam that is elevated above semiconductive material 12. In the shown embodiment, first portion 44 is longer than second portion 46. Ultimately, at least a portion of semiconductive material 16 will be movable relative to a portion of semiconductive material 12 in a microstructure comprising materials 12 and 16. For instance, surface 32 of portion 44 of material 16 can ultimately be movable relative to surface 30 of material 12, as will be discussed in more detail below with reference to FIGS. 8 and 9. Surfaces 30 and 32 can be referred to as first and second surfaces, respectively, in the description that follows.

An oxidant 48 is diffused toward assembly 50. Oxidant 48 is preferably in a vapor-phase, and can comprise, for example, one or both of OH radicals and steam. Oxidant 48 accomplishes the surface oxidation step shown as step (2) of the FIG. 4 process. Specifically, oxidant 48 oxidizes exposed surfaces 30, 32, 34, 36 and 42 of semiconductive materials 12 and 16 and anchor 40. Assembly 50 can remain within the same reaction chamber during the surface oxidation with oxidant 48 as was utilized during the etch of sacrificial material 14 (FIG. 5). If OH radicals are utilized for the surface oxidation of materials 12 and 14 and anchor 40, the OH radicals can be generated by subjecting a precursor (such as, for example, water) to a plasma. Preferably, the plasma is remote relative to assembly 50 such that the plasma does not contact exposed surfaces of assembly 50 during generation of the OH radicals. Assembly 50 can be subjected to a water rinse after exposure to OH radicals, and, depending on the precursor utilized to generate the radicals, such rinse may or may not be desired.

After the exposed surfaces of semiconductive materials 12 and 16 have been exposed to oxidant 48, excess oxidant is preferably removed from the surfaces with a suitable solvent (shown as step (3) of the FIG. 4 process). For instance, vapor-phase isopropyl alcohol can be introduced into a reaction chamber comprising assembly 50, and at least one cycle of purging of isopropyl alcohol through the reaction chamber can be used to remove excess water or other OH-containing moieties from exposed surfaces of assembly 50. Isopropyl alcohol is an exemplary solvent, and it is to be understood that other solvents, besides isopropyl alcohol, can be utilized to remove water or other OH-containing moieties from exposed surfaces of assembly 50. However, regardless of whether isopropyl alcohol or other solvents are utilized, the solvent utilized will typically be relatively polar to effectively remove water or other small OH-containing moieties. Such polar solvent can interfere with subsequent processing of the present invention, and accordingly, the first solvent is preferably removed with a second solvent that is less polar (step (4) of the FIG. 4 process). For instance, if the first solvent comprises isopropyl alcohol, the second solvent can comprise iso-octane. Vapors of the second solvent can be introduced into a reaction chamber containing assembly 50 and at least one cycle of purging of the second solvent through the reaction chamber can be utilized to displace the first solvent from exposed surfaces of assembly 50.

The first and second solvents can be introduced into the reaction chamber 60 of FIG. 10 by, for example, passing an inert gas through liquid-phase solvents to carry the solvents in vapor-phase through inlet port 62 and into the reaction chamber. An exemplary inert gas is $N_2$, with the term "inert" gas referring to a gas which is inert relative to reaction with exposed portions of assembly 50.

Figure 7:
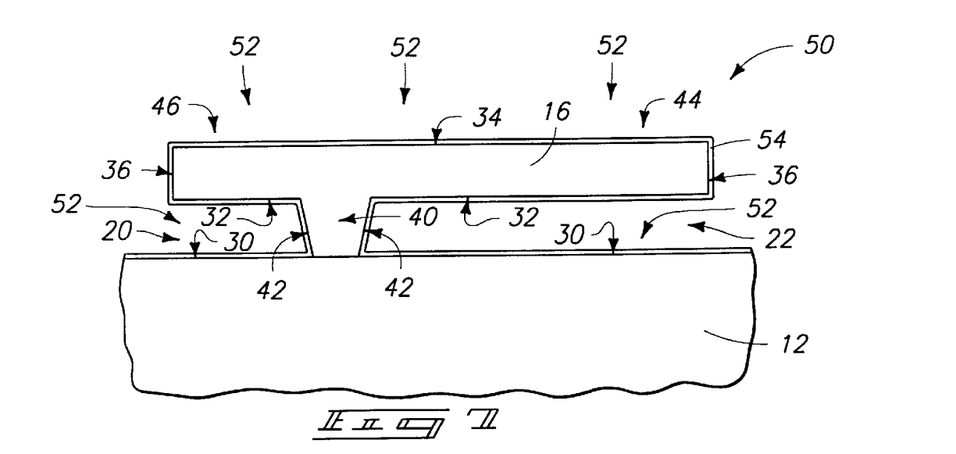
FIG. 7 is a view of the FIG. 5 assembly shown at a processing step subsequent to that of FIG. 6.

Referring to step (5) of FIG. 4, a substrate is exposed to vapor-phase alkylsilane-containing molecules. Such exposure is illustrated in FIG. 7, which shows vapor-phase alkylsilane-containing molecules 52 diffused around assembly 50 to form a coating 54 on the exposed surfaces of materials 12, 16 and anchor 40. The alkylsilane-containing molecules can be introduced into the same reaction chamber utilized for the oxidation of the exposed surfaces of assembly 50. However, the alkylsilane-containing molecules utilized for forming coating 54 will typically be highly reactive with water, and accordingly it is desired that any water residue associated with assembly 50 be removed from within the reaction chamber prior to introduction of the alkylsilane-containing molecules. Accordingly, the two-solvent rinse described above is preferably utilized after introduction of oxidant 48, and prior to introduction of the alkylsilane-containing molecules 52 into the reaction chamber.

In the shown embodiments (FIGS. 7–9), coating 54 is formed on all of surfaces 30, 32, 34, 36 and 42. However, it is to be understood that the invention encompasses other embodiments wherein the coating is formed on only some of such surfaces. Preferably, the coating will be formed on surfaces which can move proximate to one another during formation or operation of a microstructure encompassing assembly 50. For instance, if surface 32 of portion 44 of material 16 is to move proximate to surface 30 of material 12, (see FIG. 8), it can be desired that at least one of surfaces 30 and 32 have coating 54 formed thereover, and in particular embodiments it can be desired that both of surfaces 30 and 32 have coating 54 formed thereover. In other embodiments, it can be desired to form coating 54 only on portions of the surfaces 30 and 32 which can come in contact with one another.

The alkylsilane-containing molecules utilized to form coating 54 can comprise, for example, alkylhalosilane reagents, such as alkylchlorosilane reagents. Exemplary reagents include alkyltrichlorosilanes such as octyldecyltrichlorosilane or perfluorodecyltrichlorosilane. As another example, the reagents can comprise a dialkyldichlorosilane, such as, for example, dimethyldichlorosilane. Coating 54 can, in particular embodiments, comprise a self-assembled monolayer (i.e., an ordered monolayer-thick film). It is noted that surface oxidation by exposing the semiconductive surfaces to OH radicals (step (2) of FIG. 4 process) can be a preferred step for forming a high-quality self-assembled monolayer. In order to be an effective anti-stiction coating, the self-assembled monolayer should preferably be of high-quality.

Alkylsilane-containing molecules 52 can be introduced into reaction chamber 60 (FIG. 10) by bubbling an anhydrous, inert gas through a liquid source of the alkylsilane-containing molecules to transport the molecules in vapor phase into the reaction chamber. A suitable inert gas can be, for example, nitrogen ($N_2$). The formation of coating 54 can occur over surfaces having a temperature of from about 15° C. to about 100° C.; and with a pressure in the reaction chamber which is below atmospheric pressure, and yet which is sufficiently high to have a suitable amount of alkylsilane-containing molecules present for expeditious formation of coating 54. Parameters such as treatment time of an assembly and flow rate of an alkylsilane reagent within chamber 60 are preferably adjusted to form a uniform monolayer across exposed surfaces of the assembly. In particular applications, the liquid source of alkylsilane molecules can be heated to increase the vapor pressure of alkylsilane-containing molecules.

Prior art methodologies have previously been utilized to form a self-assembling monolayer from alkylsilane-containing molecules on exposed surfaces of microstructure devices. However, such prior art methods have utilized liquid-phase alkylsilane-containing molecules (such as, for example, liquid-phase alkyltrichlorosilanes), in contrast to the vapor-phase alkylsilane-containing molecules utilized in the embodiment of the present invention described herein. Numerous advantages can occur in utilizing vapor-phase alkylsilane-containing molecules for forming coating 54 relative to prior art methodologies utilizing liquid-phase alkylsilane-containing molecules. Among such advantages are that the reaction can be controlled by adjusting parameters, such as, for example, reagent flow rate and pressure within a reaction chamber when utilizing vapor-phase reactants in accordance with the present invention, whereas such controls are largely unavailable when utilizing liquid-phase reactants. The control of reagent flow rate can be utilized to control a rate of reaction, and ultimately a rate of formation of coating 54. Such control can be beneficial when it is desired to form a high quality, uniform coating.

An additional advantage of methodology of the present invention is that water can be effectively eliminated from interfering with the vapor-phase reactions occurring during processing of the present invention, whereas water is generally problematic in prior art methodologies. Specifically, the alkylsilane-containing molecules utilized for forming coating 54 tend to react readily with water, and can form solid or semi-solid polymer particles when exposed to water. The polymer particles can deposit on microstructures treated with the alkylsilane-containing molecules, and can otherwise obstruct the surface underneath the polymer particles from forming a coating. In contrast, water can be excluded from a reaction chamber during treatment of a microstructure with vapor-phase alkylsilane-containing molecules in accordance with the present invention, and accordingly deleterious side reactions can be prevented. Further, since the polymer particles formed from reaction of the water and the alkysilane-containing molecules are generally non-volatile, the particles will not be transported into a reaction chamber with alkylsilane-containing molecules during bubbling of carrier gas through the liquid source of alkylsilane-containing molecules. Accordingly, to the extent that the deleterious reaction products of alkylsilane-containing molecules and water are formed, such can be prevented from contacting a microstructure treated in accordance with methodology of the present invention.

After formation of coating 54, the supply of alkylsilane-containing molecules into the reaction chamber is stopped. Subsequently, assembly 50 can be cleaned with appropriate solvents. In particular embodiments, assembly 50 can be initially exposed to the relatively non-polar solvent previously described for preparation of the surfaces of assembly 50 for treatment with the alkylsilane-containing molecules (step (6) of FIG. 4). For instance, assembly 50 can be exposed to iso-octane to remove any excess alkylsilane-containing molecules from proximate to, or on, assembly 50 after formation of coating 54. The iso-octane can then be removed with a second solvent which is more polar than iso-octane, such as, for example, isopropyl alcohol (step (7) of FIG. 4). The second solvent can subsequently be removed with a water rinse, and then assembly 50 can be dried.

It is noted that all of the steps 1–7 of FIG. 4 can occur in the same reaction chamber, without removing or otherwise moving a treated assembly 50. Further, all of the steps 1–7 can comprise exposing the assembly 50 to vapor-phase materials, rather than to liquid-phase materials. By minimizing movement of assembly 50, flexing of various components of assembly 50 can be avoided in processing of the present invention, which can alleviate or prevent damage to the components. In contrast, prior processing would typically comprise moving an assembly between separate processing tanks during treatment of the assembly. An additional advantage of the vapor-phase-reagent processing of the present invention, relative to the liquid-phase-reagent processing of the prior art, is that vapor-phase reagents are less likely to flex or distort various components of a treated assembly than are liquid-phase reagents.

Figure 8:
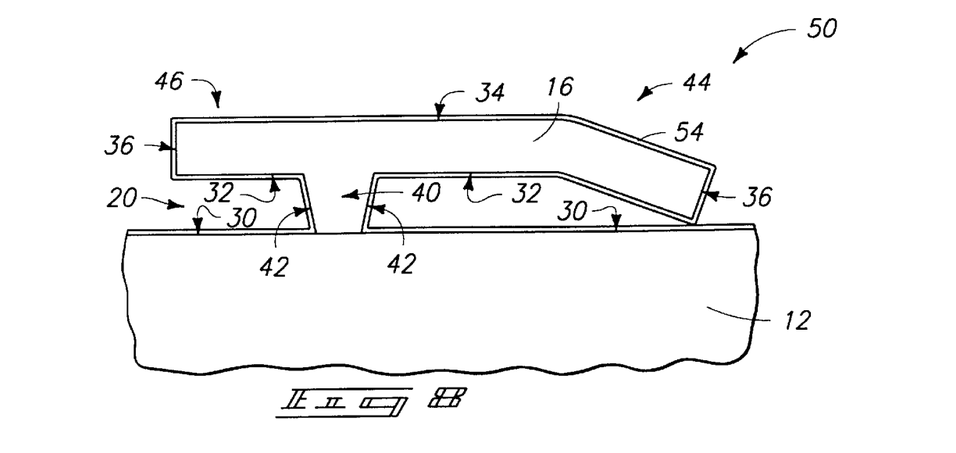
FIG. 8 is a view of the FIG. 7 assembly shown in use.
Figure 9:
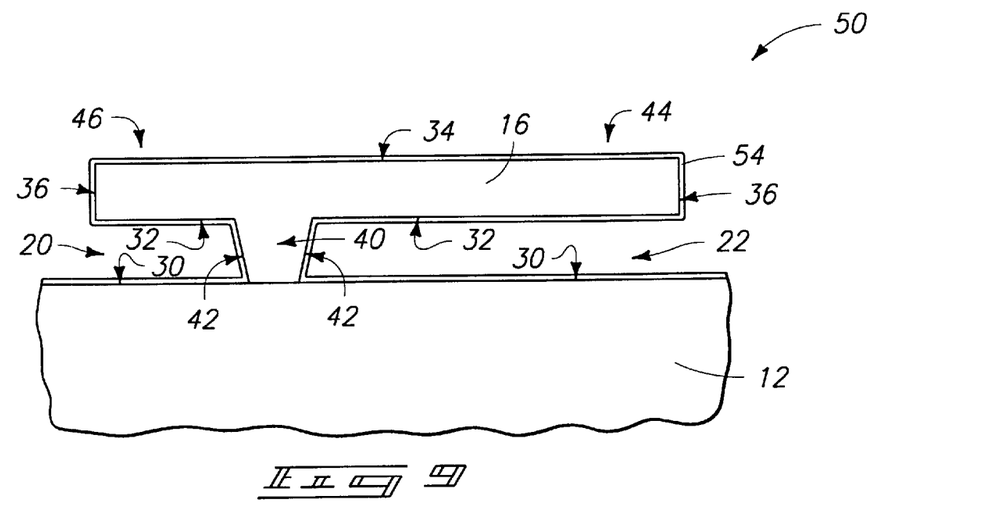
FIG. 9 is a view of the FIG. 7 assembly shown in use and in an alternative configuration to that of FIG. 8.

FIGS. 8 and 9 illustrate a process of utilizing assembly 50 after treatment by the process of FIGS. 5–7. Specifically, FIG. 8 illustrates flexing of portion 44 of material 16 to move a portion of material 16 toward material 12. Coating 54 prevents the underlying materials 16 and 12 forming the structure of the MEMS from actually contacting one another, and thus precludes adhesion of materials 16 and 12. FIG. 9 illustrates assembly 50 after portion 44 is flexed back to its original position, and shows that portion 44 does not stick to proximate semiconductive material 12.

Preferably, an assembly 50 treated in accordance with the present invention will be able to flip portion 44 relative to material 12 through at least 10 million cycles without stiction, and further the coating 54 should be thermally stable up to 400° C.

Although methodolology of the present invention is primarily described above with reference to alleviating or preventing stiction-related problems occurring between semiconductive materials, it is to be understood that microstructures (such as MEMS) can incorporate materials other than semiconductive materials (such as, for example, conductive materials; or insulative materials like silicon nitride); and that stiction-type problems can occur with such other materials. Methodology of the present invention may be useful in alleviating or preventing stiction-type problems in microstructures incorporating materials other than semiconductive materials.

What is claimed is:

1. A method of forming a microstructure device, comprising:
    providing a substrate having a first material, a second material, and a sacrificial material between the first and second materials, wherein said sacrificial material comprises silicon;
    exposing the substrate to a vapor-phase etchant comprising $XeF_2$, which removes at least a portion of the sacrificial material from between the first and second materials, to leave a surface of the first material spaced from a surface of the second material by a gap, the surface of the first material being defined as a first surface and the surface of the second material being defined as a second surface; and
    exposing at least one of the first and second surfaces to vapor-phase alkylsilane-containing molecules to form a coating over at least one of the first and second surfaces.

2. The method of claim 1 wherein the first and second materials are semiconductive materials.

3. The method of claim 1 wherein the exposure to the vapor-phase etchant and the exposure to the vapor-phase alkylsilane-containing molecules occur in the same reaction chamber.

4. The method of claim 1 further comprising exposing said at least one of the first and second surfaces to OH radicals prior to exposure to the vapor-phase alkylsilane-containing molecules.

5. The method of claim 1 wherein the alkylsilane-containing molecules include an alkylhalosilane.

6. The method of claim 1 wherein both of the first and second materials comprise silicon.

7. The method of claim 1 wherein the first material is different than the second material.

8. The method of claim 5 wherein the alkylhalosilane is an alkylchlorosilane.

9. The method of claim 5 wherein the alkylhalosilane is an alkyltrichlorosilane.

10. The method of claim 5 wherein the alkylhalosilane is a dialkyldichlorosilane.

11. The method of claim 5 wherein the alkylhalosilane is octyldecyltrichlorosilane.

12. The method of claim 5 wherein the alkylhalosilane is perfluorodecyltrichlorosilane.

13. The method of claim 5 wherein the alkylhalosilane is dimethyldichlorosilane.

14. A method of forming a microstructure device, comprising:
    providing a substrate having a first material, a second material, and a sacrificial material between the first and second materials;
    exposing the substrate to a vapor-phase etchant which removes at least a portion of the sacrificial material from between the first and second materials, to leave a surface of the first material spaced from a surface of the second material by a gap, the surface of the first material being defined as a first surface and the surface of the second material being defined as a second surface;
    exposing said at least one of the first and second surfaces to steam; and
    exposing at least one of the first and second surfaces to vapor-phase alkylsilane-containing molecules to form a coating over at least one of the first and second surfaces.

15. The method of claim 4 wherein the OH radicals are generated by exposing a precursor to a plasma.

16. A method of forming a microstructure device, comprising:

providing a substrate having a first material, a second material, and a sacrificial material between the first and second materials;

exposing the substrate to a vapor-phase etchant which removes at least a portion of the sacrificial material from between the first and second materials, to leave a surface of the first material spaced from a surface of the second material by a gap, the surface of the first material being defined as a first surface and the surface of the second material being defined as a second surface;

exposing said at least one of the first and second surfaces to one or both of OH radicals and steam; followed by exposing said at least one of the first and second surfaces to a first solvent; followed by exposing said at least one of the first and second surfaces to a second solvent which is less polar than the first solvent; followed by exposing at least one of the first and second surfaces to vapor-phase alkylsilane-containing molecules to form a coating over at least one of the first and second surfaces.

17. The method of claim 16 wherein the first solvent comprises isopropyl alcohol and the second solvent comprises iso-octane.

18. The method of claim 16 further comprising the following steps in the following sequence, occurring in the reaction chamber and after the exposure to the vapor-phase alkylsilane-containing molecules:

exposing said at least one of the first and second surfaces to the second solvent;

exposing said at least one of the first and second surfaces to the first solvent; and exposing said at least one of the first and second surfaces to water.

19. The method of claim 18 wherein the first solvent comprises isopropyl alcohol and the second solvent comprises iso-octane.

* * * * *